United States Patent [19]

Holoyda et al.

[11] Patent Number: 4,498,196
[45] Date of Patent: Feb. 5, 1985

[54] TESTABLE OPTICALLY ISOLATED CONTROL CIRCUIT

[75] Inventors: Peter W. Holoyda; Dennis W. Hollenbeck; William D. Hill, all of San Jose, Calif.

[73] Assignee: General Electric Company, San Jose, Calif.

[21] Appl. No.: 402,368

[22] Filed: Jul. 27, 1982

[51] Int. Cl.³ .............................................. H04B 9/00
[52] U.S. Cl. .............................. 455/607; 340/825.06; 455/603
[58] Field of Search ............... 455/601, 603, 605, 606, 455/607, 608, 612, 617; 340/825.06, 825.17; 324/96, 418, 424

[56] References Cited

U.S. PATENT DOCUMENTS

| 3,924,178 | 12/1975 | Lockyer et al. | 324/418 |
| 3,928,760 | 12/1975 | Isoda | 455/603 |

FOREIGN PATENT DOCUMENTS

| 52-43089 | 4/1977 | Japan | 340/825.06 |
| 53-152901 | 12/1979 | Japan | 455/608 |
| 55-115746 | 9/1980 | Japan | 455/606 |
| 56-52947 | 5/1981 | Japan | 455/608 |
| 238007 | 11/1969 | U.S.S.R. | 324/418 |

OTHER PUBLICATIONS

Attrill, Infra Red Remote Control System, Radio and Electronic Construction, vol. 34, No. 11 Jul. 1981 pp. 602-605.
Campbell et al., T3 Rate Fiber Optic Terminal Equip., Conf. Intelcon 79 Exp. Procedings Dallas TX., Feb. 26-Mar. 2 1979 pp. 177-183.
Schussler, Optoelectronic Signal Transmission, AEG-Telefunkon Conf. Laser 77, Opts Electronics, Munich Germany Jun. 20-24 1977 pp. 472-489.

*Primary Examiner*—Joseph A. Orsino, Jr.
*Attorney, Agent, or Firm*—Ivor J. James, Jr.; Samuel E. Turner; Raymond G. Simkins

[57] ABSTRACT

A testable physically isolated control circuit includes a first unit 10, a second unit 40, and an optical coupler 30 to couple units 10 and 40 together. The functional portion 10a of the first unit includes an input terminal 11 and an oscillator 12 for controlling a first transmitter 17. Signals from the first transmitter are received by a receiver 44 in unit 40 to control the relay 48. Each unit 10 and 40 also includes a testing portion 10b and 40b for monitoring the condition of the functional portions. The testing portion 40b detects the state of the receiver 44 and the relay 48 and transmits this information via transmitter 65 to a receiver 22 in first unit 10. This receiver 22 controls input terminals 29 and 15 to provide control information concerning the proper functioning of the circuit.

1 Claim, 1 Drawing Figure

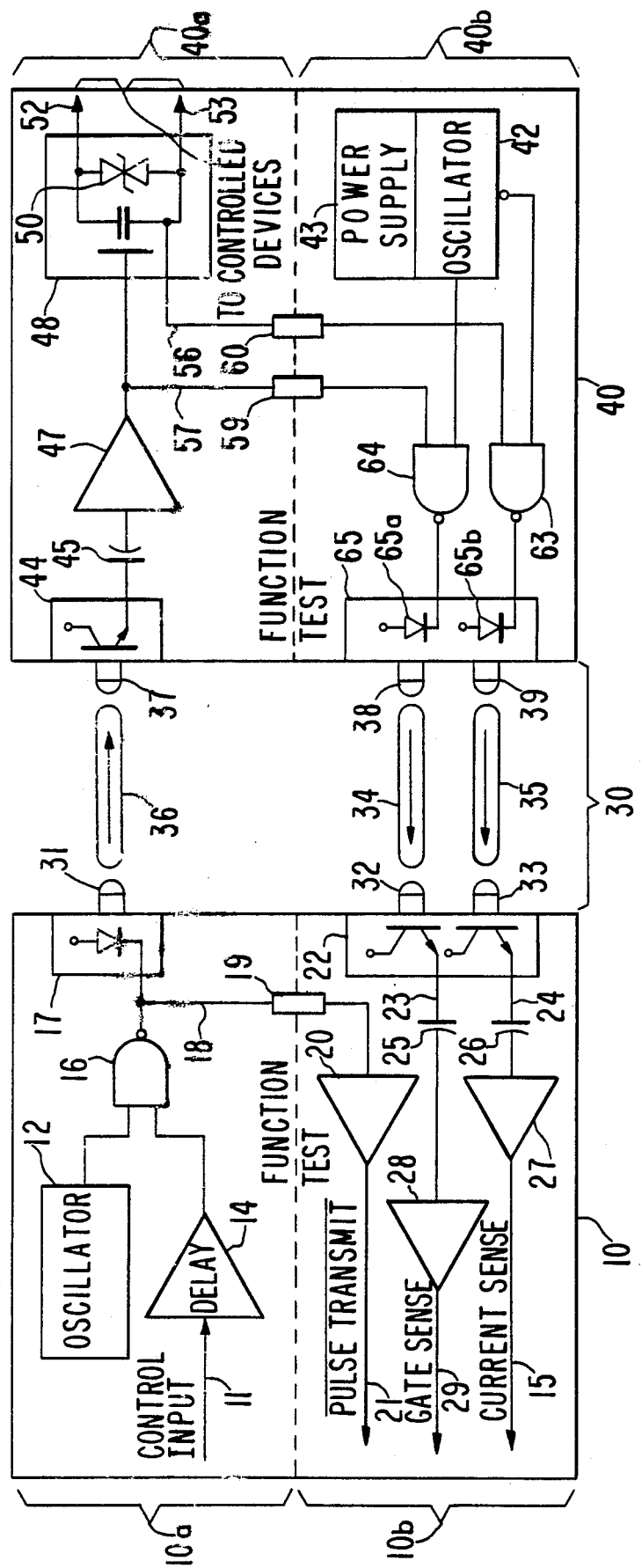

TESTABLE OPTICALLY ISOLATED CONTROL CIRCUIT

BACKGROUND OF THE INVENTION

1. Field of the Invention

This invention relates to electric circuits, and, in particular, to an optically isolated control circuit which allows continuous monitoring of the circuit being controlled to verify its proper operation.

2. Description of the Prior Art

In the design of many control systems it is frequently desirable to situate the object or device being controlled remotely from the control input signal. Furthermore, in many such installations, for example, nuclear power plants, it is desirable to completely isolate the control device from the control input. Although this has been achieved with prior art control systems, such control systems have typically been unable to monitor the correct operation of the device or object being controlled. For example, in prior art control systems, the control input signal has been supplied to a remotely situated object being controlled using optical or electronic techniques, but the station from which the control input signal was generated has been unable to detect the correct functioning of the remainder of the isolated control system.

SUMMARY OF THE INVENTION

This invention provides a testable optically isolated control circuit suitable for use in applications wherein a controlling station must be physically isolated from a controlled device. The invention is particularly useful for applications in which a device is to be controlled which must be physically and electrically separate from the source of the control input, yet have the transmission, reception, and condition of the controlled device continuously monitored at the source of the control signals. Typical applications include the control of remotely situated electrical devices in nuclear power plants.

In one embodiment, the testable optically isolated control circuit of this invention includes first and second physically separated units, the first unit including: an input terminal for receiving a control signal, a first transmitter for transmitting the control signal to the second unit, a first sensor for monitoring the first transmitter and supplying a signal indicative of the state of the first transmitter, and a first receiver for receiving signals; and the second unit including: a second receiver for receiving signals from the first transmitter and controlling relay means in response thereto, a second sensor connected to the second receiver and the relay means for detecting their operation, and a second transmitter connected to the second sensor for transmitting signals therefrom to the first receiver. The first unit also includes output terminals connected to receive signals from the first sensor and the first receiver. In the preferred embodiments, each of the transmitters includes an oscillator and at least one logic gate coupled to the transmitter.

BRIEF DESCRIPTION OF THE DRAWING

The FIGURE is a schematic diagram of the preferred embodiment of the invention.

DETAILED DESCRIPTION OF THE PREFERRED EMBODIMENT

As shown generally in the FIGURE, the invention includes a first unit 10, a second unit 40, and means 30 for communicating between the two units. In the preferred embodiment, units 10 and 40 are physically and electrically separate from each other, and are coupled together using optical techniques. As shown, each unit 10 or 40 includes an upper functional section 10a or 40a which, as will be explained, is used to control the desired device, and a lower test section 10b or 40b which monitors the operation of the functional section to assure the proper control signals are being transmitted and received, and that the controlled device is being correctly controlled.

The functional section of unit 10 includes a terminal 11 to which the desired control input signal is supplied. The control input signal will be generated using well-known apparatus not shown in the FIGURE. For example, known sensors may detect temperature or other desired parameters and supply appropriate control inputs on line 11 to regulate the state of a control device coupled to lines 52 and 53 in unit 40. Any desired filtering, delay, or amplification of the control input signal will be performed by unit 14 before the control input signal is supplied to a first terminal of NAND gate 16. An oscillator 12 is coupled to the other terminal of NAND gate 16, and the output of NAND gate 16 is coupled to the first transmitter 17. Because in the preferred embodiment the coupling 30 between the input unit 10 and the output unit 40 is optical, oscillator 12 has a pulse rate of 100 kHz to eliminate potential interference with ordinary 60 Hertz light sources. The 100 kHz signal from oscillator 12 coupled to control input 11 through gate 16 causes the light-emitting diode in first transmitter 17 to pulse at this rate, and these pulses are detected by the photo diode in receiver 44 in unit 40.

Because in the preferred embodiment the units 10 and 40 are used in conjunction with control systems in a nuclear power plant, a relatively thick wall of steel, concrete, or other impervious material may be interposed between units 10 and 40. Transmission of light through such a wall, while retaining its isolation, is achieved by a first lens 31, a quartz tube 36, and a second lens 37. Of course, in installations where such rigorous isolation is not necessary, the transmission between first transmitter 17 and receiver 44 may be achieved using other known techniques.

Receiver 44 is capacitively coupled through capacitor 45 to amplifier 47. The amplifier 47 is a retriggerable multivibrator having a time constant such that it provides a DC signal to the relay 48 as long as it is receiving the AC signal from receiver 44. Capacitor 45 limits the bandwidth of the transmitted signal to reject any 60 Hz noise and lower frequency noises.

As long as light pulses continue to cross the optical boundary 30 to the output unit 40, this multi-vibrator section will hold a DC load-activating signal. The load-activating signal drives relay 48 to control the device connected to lines 52 and 53. A surge protection diode 50 is commonly included in relay 48.

To assure the highest reliability of the functional portions of the units 10 and 40, their condition is continually monitored by the test portions 10b and 40b of units 10 and 40, respectively. Line 18 in unit 10a is connected to continuously receive the output signals from gate 16 driving transmitter 17. This line is connected through resistance 19 and inverter 20 to terminal 21. Terminal 21 therefore will continuously present a signal complementary to the output signal from gate 16. Terminal 21 will be connected to other known monitoring circuitry which may be used to sound an alarm, activate a redundant control system, or perform other known functions should the control input supplied to terminal 11 and the inverted pulse transmit signal on terminal 21 be of incorrect phase with respect to each other.

A tap formed by line 57 is made between amplifier 47 and relay 48. This line is connected through resistance 59 to one terminal of NAND gate 64. The other terminal of NAND gate 64 is connected to oscillator 42, which is driven by a remotely situated power supply 43. The output from gate 64 drives a light-emitting diode 65a within second transmitter 65.

A second tap 56, typically a single loop coil, is made within relay 48 to permit continuous monitoring of its condition. This tap is connecteed through resistance 60 to one terminal of NAND gate 63. The other terminal of gate 63 is connected to oscillator 42 and drives a second light-emitting diode 65b within transmitter 65.

In the same manner as described in conjunction with transmitter 17, transmitter 65 produces signals which are detected by receiver 22. The light output from the light-emitting diode coupled to gate 64 is transmitted via lens 38, quartz tube 34, and lens 32 to the photo diode connected to line 23. In a similar fashion, the output from gate 63 is transmitted through lens 39, quartz tube 35, and received by lens 33, where it controls the photo diode coupled to line 24. Capacitors 25 and 26 are connected to lines 23 and 24 to provide the same function as capacitor 45, explained above.

The outputs from receiver 22 are then capacitively coupled using capacitors 25 and 26 to amplifiers 27 and 28, which, in turn, control noeds 15 and 29. The signal supplied to node 29 indicates the proper reception of the transmitted control signal, while the signal supplied to node 15 is indicative of the proper operation of relay 48. Nodes 15 and 29 may be connected to monitoring equipment similar to that connected to node 21.

Table 1, bellow, illustrates the overall operation of the units 10 and 40.

TABLE 1

| INPUT UNIT 10 | | OUTPUT UNIT 40 | |
|---|---|---|---|
| Control 11 | Pulse Transmit L.E.D. 17 | Gate Sense L.E.D. 65a | Current Sense L.E.D. 65b |
| "OFF" | No Light | No Light | Light Pulse Transmission |
| "ON" | Light Pulse Transmission | Light Pulse Transmission | No Light |

Of particular advantage is that the proper operation of units 10 and 40, and the intervening lenses and tubes 30 may be verified by activating control signal 11 for short times, on the order of milliseconds, without activating the controlled device. When such a test is performed, the outputs 21, 29 and 15 of the test circuit in unit 10b should all change states for that time, yet by appropriate control of duration of the pulse the controlled device, with its typically relatively greater mass, will not change state. The invention therefore provides a higher reliability physically isolated control system, all parts of which are continually monitored of proper operation. The control system allows on-line testing of its proper function.

Although a preferred embodiment of the invention has been described above, this embodiment is intended to illustrate the invention rather than limit it. It will be obvious to those of ordinary skill in the art that various modifications may be made to this system without departing from the scope of the invention. For example, radio signals or other means may be used to communicate between the two physically separated units. The scope of the invention may be determined from the following claims.

We claim:

1. In a system including a control signal transmitting station physically isolated from a control signal receiving station for controlling the state of a controlled device, a method for monitoring at said transmitting station the operation of said system including the state of an operating relay for controlling said controlled device, the transmission of said control signal by said transmitting station, and the reception of said control signal by said receiving station, comprising the steps of:
    1. providing transmitting means for transmitting said control signal from said transmitting station to said receiving station in response to an input signal applied to an input terminal of said transmitting station;
    2. providing first sensing means for monitoring said transmitting means and providing a first monitoring signal indicative of the transmission of said control signal;
    3. providing receiving means at said receiving station for receiving said control signal from said transmitting means and for changing the state of said operating relay for said controlled device in response thereto;
    4. providing second sensing means for monitoring said receiving means and for transmitting a second monitoring signal indicative of the receipt of said control signal;
    5. providing third sensing means for monitoring said operating relay for said controlled device and for transmitting a third monitoring signal indicative of actuation of said operating relay; and
    6. applying a test control signal to said input terminal of said transmitting station of a duration sufficient to change the state of said first, second and third monitoring signals indicative of proper operation of said system but of insufficient duration to cause change of state of said controlled device whereby operation of said system is monitored and can be tested without disruption of the normal operation of said controlled device and whereby normal operation of said controlled device does not disrupt operation of said system.

* * * * *